United States Patent
Uebayashi et al.

(10) Patent No.: US 9,219,018 B2
(45) Date of Patent: Dec. 22, 2015

(54) GAS BARRIER FILM

(75) Inventors: Hiroyuki Uebayashi, Otsu (JP); Yusuke Tsukamura, Otsu (JP); Osamu Watanabe, Otsu (JP)

(73) Assignee: Toray Industries, Inc., Tokyo (JP)

( * ) Notice: Subject to any disclaimer, the term of this patent is extended or adjusted under 35 U.S.C. 154(b) by 254 days.

(21) Appl. No.: 14/009,664

(22) PCT Filed: Mar. 29, 2012

(86) PCT No.: PCT/JP2012/058388
§ 371 (c)(1),
(2), (4) Date: Oct. 3, 2013

(87) PCT Pub. No.: WO2012/137662
PCT Pub. Date: Oct. 11, 2012

(65) Prior Publication Data
US 2014/0026961 A1     Jan. 30, 2014

(30) Foreign Application Priority Data

Apr. 5, 2011  (JP) ................................. 2011-083409

(51) Int. Cl.

| | |
|---|---|
| H01L 23/28 | (2006.01) |
| H01L 31/0203 | (2014.01) |
| H01L 31/0216 | (2014.01) |
| H01L 31/048 | (2014.01) |
| H01L 33/52 | (2010.01) |
| H01L 23/29 | (2006.01) |
| H01L 23/00 | (2006.01) |
| H01L 33/54 | (2010.01) |
| H01L 31/0392 | (2006.01) |
| C09D 1/00 | (2006.01) |
| H01L 51/52 | (2006.01) |

(52) U.S. Cl.
CPC ............... *H01L 23/296* (2013.01); *C09D 1/00* (2013.01); *H01L 23/564* (2013.01); *H01L 31/0203* (2013.01); *H01L 31/02161* (2013.01); *H01L 31/0392* (2013.01); *H01L 31/048* (2013.01); *H01L 33/54* (2013.01); *H01L 51/5253* (2013.01); *H01L 2924/0002* (2013.01); *Y02E 10/50* (2013.01); *Y10T 428/24355* (2015.01); *Y10T 428/265* (2015.01)

(58) Field of Classification Search
CPC . H01L 23/28; H01L 31/0203; H01L 31/0216; H01L 31/048; H01L 33/52
USPC ........................................................ 136/259
See application file for complete search history.

(56) References Cited

FOREIGN PATENT DOCUMENTS

| | | |
|---|---|---|
| JP | 08-142252 | 6/1996 |
| JP | 2002-113826 A | 4/2002 |
| JP | 2002-154184 A | 5/2002 |
| JP | 2005-289041 A | 10/2005 |
| JP | 2009-125965 A | 6/2009 |

OTHER PUBLICATIONS

International Search Report dated Jul. 3, 2012, application No. PCT/JP2012/058388.

*Primary Examiner* — Susan D Leong
(74) *Attorney, Agent, or Firm* — RatnerPrestia

(57) ABSTRACT

An object of the invention is to provide a gas barrier characteristic film that has a gas barrier characteristic and that is excellent in the repetitive reproducibility of the gas barrier characteristic. The film is a gas barrier characteristic film in which an [A] layer and a [B] layer mentioned below are sequentially layered on at least one surface of a macromolecular base, the [A] layer being a crosslinked resin layer whose pencil hardness is greater than or equal to H and whose surface free energy is less than or equal to 45 mN/m, and the [B] layer being a silicon-containing inorganic layer whose thickness is 10 to 1000 nm.

11 Claims, 1 Drawing Sheet

GAS BARRIER FILM

CROSS REFERENCE TO RELATED APPLICATIONS

This application is the U.S. National Phase application of PCT/JP2012/058388, filed Mar. 29, 2012, and claims priority to Japanese Patent Application No. 2011-083409, filed Apr. 5, 2011, the disclosure of each of these applications being incorporated herein by reference in their entireties for all purposes.

FIELD OF THE INVENTION

The invention relates to a gas barrier characteristic film that is put to use as wrapping for foods or medicines which requires high gas barrier characteristic, or to use as electronic members of solar batteries, electronic papers, organic electroluminescence (EL) displays, etc.

BACKGROUND OF THE INVENTION

Gas barrier characteristic films, which are made by using on a surface of a macromolecular base an inorganic substance (including inorganic oxides), such as aluminum oxide, silicon oxide, magnesium oxide, etc., and forming a vapor-deposited film of such an inorganic substance through utilization of a physical vapor deposition method (PVD method), such as a vacuum evaporation method, a sputtering method, an ion plating method or the like, a chemical vapor deposition method (CVD method), such as a plasma chemical vapor deposition method, a thermal chemical vapor deposition method, a photo-chemical vapor deposition method or the like, etc., are used as wrapping materials for foods, medicines, etc. that require blockage of various gasses, such as water vapor, oxygen, etc. and as members of electronic devices, such as thin-screen televisions, solar batteries, etc.

As a gas barrier characteristic-improving technology there is used, for example, a method that improves gas barrier characteristic while maintaining transparency by forming on a base a compound that contains silicon oxide as a main component and also at least one species selected from carbon, hydrogen, silicon and oxygen by a plasma CVD method through the use of a gas that contains vapor of an organic silicon compound and oxygen (patent document 1). Furthermore, as a gas barrier characteristic-improving technology other than the film formation method such as the plasma CVD method or the like, there is used a smooth base in which protrusions or irregularities that can be causes of occurrence of pinholes or cracks that deteriorate the gas barrier characteristic have been reduced, or a base provided with an anchor coat layer for the purpose of smoothing the surface (patent document 2).

PATENT DOCUMENTS

Patent Document 1: Japanese Patent Application Publication No. 8-142252 (claims)
Patent Document 2: Japanese Patent Application Publication No. 2002-113826 (claims)

SUMMARY OF THE INVENTION

The method in which a layer having gas barrier characteristic that contains silicon oxide as a main component is formed by the plasma CVD method has a problem, among others, that since the base surface is affected by light-emitting heat of plasma, impact of ions or radicals, etc., the film quality of gas barrier layers formed varies depending on the kinds of bases and therefore a stable gas barrier characteristic cannot be obtained.

On the other hand, the method that uses as a base for forming a gas barrier layer a smooth base or a base equipped with an anchor coat for the purpose of smoothing the surface improves the reproducibility of the gas barrier characteristic by preventing occurrence of pinholes and cracks, but does not better the film quality of the gas barrier layer formed and therefore does not achieve drastic improvement in performance.

The invention, in view of the aforementioned background of the related art, provides a gas barrier characteristic film made capable of drastic improvement in gas barrier characteristic and manifestation of stable gas barrier characteristic.

In order to solve the foregoing task, the invention adopts means as follows according to exemplary embodiments. That is, (1) A gas barrier characteristic film in which an [A] layer and a [B] layer mentioned below are layered in this order on at least one surface of a macromolecular base,
the [A] layer being a crosslinked resin layer whose pencil hardness is greater than or equal to H and whose surface free energy is less than or equal to 45 mN/m, and
the [B] layer being a silicon-containing inorganic layer whose thickness is 10 to 1000 nm.
(2) The [B] layer is constructed of a composition containing a zinc compound and a silicon oxide.
(3) The [B] layer is one of a [B1] layer and a [B2] layer mentioned blow,
the [B1] layer being a layer made up of a coexistence phase of a zinc oxide, a silicon dioxide and an aluminum oxide.
the [B2] layer being a layer made up of a coexistence phase of a zinc sulfide and the silicon dioxide.
(4) The [B] layer is the [B1] layer, and the [B1] layer is constructed of a composition in which a zinc (Zn) atom concentration is 20 to 40 atom %, a silicon (Si) atom concentration measured is 5 to 20 atom %, an aluminum (Al) atom concentration measured is 0.5 to 5 atom % and an oxygen (O) atom concentration measured is 35 to 70 atom %, the atom concentrations being measured by an ICP emission spectrometry method.
(5) The [B] layer is the [B2] layer, and the [B2] layer is constructed of a composition in which a molar fraction of the zinc sulfide to a sum of the zinc sulfide and the silicon dioxide is 0.7 to 0.9.
(6) An average surface roughness Ra of the [A] layer is less than or equal to 1 nm.
(7) The average surface roughness Ra of the [B] layer is less than or equal to 1.5 nm.
(8) The gas barrier characteristic film has a transparent electroconductive layer on a surface of the [B] layer or between the macromolecular base and the [A] layer.
(9) The transparent electroconductive layer contains any species selected from an indium tin oxide (ITO), a zinc oxide (ZnO), an aluminum-containing zinc oxide (Al/ZnO), a gallium-containing zinc oxide (Ga/ZnO), a metal nanowire and a carbon nanotube.
(10) A solar battery having the gas barrier characteristic film according to any one of (1) to (9).
(11) A display unit's element having the gas barrier characteristic film according to any one of (1) to (9).
What have been mentioned above are preferable aspects.

It is possible to provide a gas barrier characteristic film that has high gas barrier characteristic against oxygen gas, water vapor, etc.

DETAILED DESCRIPTION OF EMBODIMENTS OF THE INVENTION

The inventors did vigorous studies for the purpose of obtaining a gas barrier characteristic film that is good in gas barrier characteristic without choosing a kind of a base, and found out that the aforementioned task was solved all at once when a crosslinked resin layer having a specific pencil hardness and a specific surface free energy and a silicon-containing inorganic layer of a specific thickness were disposed in this order on at least one surface of a macromolecular base.

Figure 1:
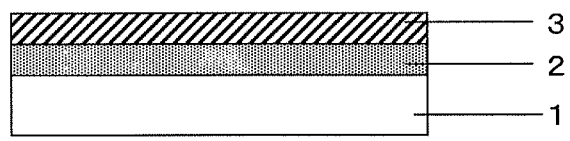
FIG. 1 is a sectional view showing an example of the gas barrier characteristic film of the invention.

FIG. 1 is a sectional view showing an example of the gas barrier characteristic film of the invention. The gas barrier characteristic film an embodiment of the invention, as shown in FIG. 1, is a film in which a crosslinked resin layer whose pencil hardness is greater than or equal to H and whose surface free energy is less than or equal to 45 mN/m, as an [A] layer, and a silicon-containing inorganic layer whose thickness is 10 to 1000 nm, as a [B] layer, have been layered in this order on a surface of a macromolecular base 1.

[Macromolecular Base]

The macromolecular base used in the invention is not particularly limited in material as long as the base has a film form. However, since the film has a flexibility needed for gas barrier films, the base is preferred to be of an organic macromolecule. As organic macromolecules that can be suitably used in the invention, there can be cited, for example, various polymers, including polyolefins, such as polyethylene, polypropylene, etc., polyesters, such as polyethylene terephthalate, polyethylene naphthalate, etc., polyamide, polycarbonate, polystyrene, polyvinyl alcohol, saponified substances of ethylene vinyl acetate copolymer, polyacrylonitrile, polyacetal, etc. Among these, organic macromolecules that contain polyethylene terephthalate are preferred. Furthermore, the organic macromolecule may be either a single polymer or a copolymer, and a single kind of organic macromolecule may be used, or plural kinds of organic macromolecules may also be blended and used.

Furthermore, organic macromolecules that can be suitably used in the macromolecular base in the invention, as listed above, are organic macromolecules whose basic skeleton is linear (herein, being linear indicates that the basic skeleton does not have a network structure although it may have a branching. Hereinafter, an organic macromolecule whose basic skeleton is linear will be simply termed linear organic macromolecule). Incidentally, even if crosslinking is formed partially in the organic macromolecule by adding a crosslinking agent having two or more functional groups in its molecule or by radiation exposure, the organic molecule is defined as being a linear organic macromolecule provided that the number-average molecular weight thereof is 5000 to 20000. As for the linear organic macromolecule in this case, the pencil hardness is preferred to be in the range of F and below.

As for the form of the macromolecular base, the base may be a single layer film, or a film of two or more layers that has been film-formed by, for example, a coextrusion method. As for the kind of the film, a film extended in a direction of one axis or directions of two axes may be used. It does not matter if a macromolecular base surface on a side where the crosslinked resin layer and the silicon-containing inorganic layer are formed is subjected to a pre-treatment, such as a corona treatment, an ion bombardment treatment, a solvent treatment, a surface-roughing treatment and a treatment of forming an anchor coat layer constructed of an organic substance or an inorganic substance or a mixture thereof, in order to better adhesion characteristic. Furthermore, it does not matter if the opposite surface to the side where the crosslinked resin layer and the gas barrier layer are formed is provided with a coating layer of an organic substance or an inorganic substance or a mixture thereof for the purpose of improving the slippage characteristic of the film at the time the film is wound.

The thickness of the macromolecular base for use in the invention is not particularly limited. However, the thickness thereof is preferred to be less than or equal to 500 μm from the viewpoint of securing a flexibility, and is preferred to be greater than or equal to 5 μm from the viewpoint of securing a strength against pull or impact. Furthermore, in light of ease in the processing and handling of the film, it is preferred that the lower limit thereof be greater than or equal to 10 μm and the upper limit thereof be less than or equal to 200 μm.

[Crosslinked Resin Layer]

Next, the [A] layer, which is a crosslinked resin layer whose pencil hardness is greater than or equal to H and whose surface free energy is less than or equal to 45 mN/m will be described in detail.

The thickness of the [A] layer for use in the invention is preferred to be greater than or equal to 0.5 μm and less than or equal to 10 p.m. If the thickness of the [A] layer is thinner than 0.5 μm, the film quality of the [B] layer does not become consistent due to effect of the irregularities of the macromolecular base, so that the gas barrier characteristic may sometimes deteriorate. If the thickness of the [A] layer is thicker than 10 μm, the stress that remains in the [A] layer becomes large so that the macromolecular base warps, and cracks occur in the [B] layer; therefore, the gas barrier characteristic may sometimes decline. Hence, the thickness of the [A] layer is preferred to be greater than or equal to 0.5 μm and less than or equal to 10 μm, and is more preferred to be greater than or equal to 1 μm and less than or equal to 5 μm from the viewpoint of securing a flexibility. The thickness of the [A] layer is able to be measured from a cross-sectional observation image taken by a transmission type electron microscope (TEM).

In the invention, the contribution of the pencil hardness of the [A] layer to the effect of enabling the manifestation of stable gas barrier characteristic is speculated to come as follows. Because the pencil hardness of the [A] layer is greater than or equal to H, the macromolecular base can be provided with heat resistance and dimensional stability, so that when the silicon-containing inorganic layer is to be formed, damage caused by light-emitting heat of plasma or impact of ions or radicals can be prevented. As a result, the reproducibility of the gas barrier characteristic becomes stable. Therefore, the pencil hardness of the [A] layer is preferred to be greater than or equal to H, and is more preferred to be greater than or equal to 2H. On another hand, if the upper limit of the pencil hardness of the [A] layer exceeds 5H, the flexibility declines, which may sometimes become a cause of deterioration of the gas barrier characteristic due to cracks in the handling or post-processing after the silicon-containing inorganic layer is formed. Therefore, the upper limit thereof is preferred to be less than or equal to 5H. (The pencil hardness is (soft) 10B to B, HB, F, and H to 9H (hard).)

The pencil hardness test of the [A] layer in the invention is conducted according to JIS K5600 (1999). Using pencils of different hardnesses, the test is conducted under a load of 0.5 kg, and determination is made on the basis of the presence or absence of a flaw. Incidentally, in the case where an [A] layer surface is laminated with an inorganic layer or a resin layer, the pencil hardness can be evaluated by conducting the pencil hardness test after the inorganic or resin layer is removed by ion etching or a chemical solution treatment according to need.

Furthermore, in the invention, the contribution of the surface free energy of the [A] layer to the effect of the gas barrier characteristic becoming drastically better is speculated to come as follows. Because the surface free energy is less than or equal to 45 mN/m, atoms or particles that serve as film growth cores in the initial growth process of a silicon-containing inorganic compound when the [B] layer is formed are more apt to move on surfaces and spread, so that the film quality in the vicinity of the [B] layer becomes compact. As a result, the entire layer is bettered to a compact structure, so that permeation of oxygen and water vapor is restrained. Therefore, the surface free energy of the [A] layer is preferred to be less than or equal to 45 mN/m, and is more preferred to be less than or equal to 40 mN/m.

As for the surface free energy of the [A] layer in the invention, individual components (dispersion force, polar force and hydrogen bonding force) can be calculated from the following expression (1) derived from the extended Fowkes' equation and Young's equation through the use of four kinds of measurement liquids (water, form amide, ethylene glycol and methylene iodide) whose components (dispersion force, polarity force and hydrogen bonding force) are known after the contact angles of the measurement liquids are measured.

[EXPRESSION 1]

$$(\gamma Sd \cdot \gamma Ld)^{0.5} + (\gamma Sp \cdot \gamma Lp)^{0.5} + (\gamma Sh \cdot \gamma Lh)^{0.5} = \frac{\gamma L(1 + \cos\theta)}{2} \quad (1)$$

where $\gamma S=\gamma Sd+\gamma Sp+\gamma Sh$, and $\gamma L=\gamma Ld+\gamma Lp+\gamma Lh$
$\gamma S$: surface energy of [A] layer
$\gamma Sd$: dispersion force component of [A] layer
$\gamma Sp$: polar force component of [A] layer
$\gamma Sh$: hydrogen bonding force of [A] layer
$\gamma L$: surface energy of measurement liquid
$\gamma Ld$: dispersion force component
$\gamma Lp$: polar force component
$\gamma Lh$: hydrogen bonding force
$\theta$: contact angle of measurement liquid on [A] layer Incidentally, in the case where the [A] layer surface is laminated with an inorganic layer or a resin layer, the contact angles of the four kinds of measurement liquids in conjunction with the gas barrier characteristic film of the invention are measured after the [A] layer is polished to an extent of 30 to 70% of the thickness of the [A] layer by ion etching or a chemical solution treatment. Although the [A] layer is positioned between the silicon-containing inorganic layer and the macromolecular base layer, the pencil hardness and the surface free energy of the [A] layer can be evaluated by performing the foregoing measurement after either one of the two layers is removed by ion etching or a chemical solution treatment according to need.

If the average surface roughness Ra of the surface of the [A] layer (the boundary surface with the [B] layer in the gas barrier characteristic film) in the invention is set to 1 nm or less, occurrence of pinholes and cracks in the [B] layer layered on the [A] layer can be reduced, and therefore the repetitive reproducibility of the gas barrier characteristic improves. Thus, the average surface roughness Ra being 1 nm or less is preferred. If the average surface roughness Ra of the surface of the [A] layer is greater than 1 nm, the [B] layer, after being layered thereon, is likely to obtain occurrence of pinholes in the protrusion portions, and the portions with many irregularities will obtain occurrence of cracks, which may sometimes become a cause of deterioration of the repetitive reproducibility of the gas barrier characteristic. Hence, in the invention, it is preferred to make the average surface roughness Ra of the surface of the [A] layer less than or equal to 1 nm, and it is more preferred to make it less than or equal to 0.6 nm from the viewpoint of restraining the occurrence of small defects, such as micro-cracks at the time of bending process, etc., and improving flexibility.

The average surface roughness Ra of the [A] layer in the invention can be measured by using an atomic force microscope. Incidentally, in the case where the [A] layer surface is laminated with the inorganic layer or the resin layer, a value obtained by using an X-ray reflectivity technique ("Introduction to X-ray Reflectivity" (edited by Sakurai Kenji) Koudansha, pp. 51 to 78, 2009) is set as the average surface roughness Ra of the [A] layer.

As for a material of the [A] layer for use in the invention is not particularly limited and various crosslinked resins can be used as the material, as long as the pencil hardness greater than or equal to H and the surface free energy less than or equal to 45 mN/m are achieved. The crosslinked resin herein is defined as a resin that has one or more crosslinking points per a number-average molecular weight of 20000. As examples of a crosslinked resin applicable to the crosslinked resin layer in the invention, crosslinked reins, such as acryl-based resins, urethane-based resins, organic silicate compounds, silicone-based resins, etc., can be cited. Among these, thermosetting type acryl-based resins and actinic ray-setting type acryl-based resins are preferred from the viewpoint of endurance against plasma heat and pencil hardness.

As for the thermosetting type acryl-based resin and the actinic ray-setting type acryl-based resin, resins that contain a multifunctional acrylate, an acryl oligomer and a reactive diluent may be preferably presented as examples. Furthermore, a photoinitiator, a photosensitizer, a thermal polymerization initiator, a reformer, etc. may be added therein according to need.

As for the multifunctional acrylate that is suitably used in the acryl-based resin, compounds having three or more (meth)acryloyl oxy groups in one molecule are cited. As examples of such compounds, pentaerythritol tri(meth)acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth)acrylate, trimethylol propane tri(meth)acrylate, etc. can be cited. These multifunctional acrylates can be used singly or as a mixture of two or more species thereof. Furthermore, in the invention, the multifunctional acrylate may include a modified polymer of the multifunctional acrylate.

The acryl oligomer is an oligomer whose number-average molecular weight is 100 to 5000 and in whose molecule at least one reactive acryl group is bonded. As the skeleton, polyacryl-based resin, polyester-based resin, polyurethane-based resin, polyepoxy-based resin, polyether-based resin, etc. can be cited. Furthermore, the aforementioned skeleton may also be a rigid skeleton of melamine, isocyanuric acid, etc.

The reactive diluent is a substance which, serving as a medium of a coating agent, performs the function of a solvent in a coating step, and which has a group that reacts with a monofunctional or multifunctional acryl oligomer and which becomes a copolymerization component of the coating film.

Furthermore, particularly in the case of crosslinking by ultraviolet rays, since the light energy is small, it is preferred to add a photopolymerization initiator and/or a photosensitizer in order to facilitate conversion of light energy or reaction, although details will be described later.

The proportion of the multifunctional acrylate used in compounding materials of the [A] layer for use in the invention is preferred to be 20 to 90 mass % relative to the total amount of the [A] layer, and is more preferred to be 40 to 70 mass %, from the viewpoint of making the pencil hardness greater than or equal to H. If this proportion is greater than 90 mass %, there sometimes occurs a case where the cure shrinkage is great and the macromolecular base warps. In such a case, cracks occur in the silicon-containing inorganic layer, sometimes giving rise to the problem of deterioration of the gas barrier characteristic, or the like. Furthermore, if the proportion of the monomer is smaller than the 20 mass %, the strength of adhesion between the base and the [A] layer may decline, sometimes giving rise to the problem of peel-off, or the like.

As for the method of crosslinking the [A] layer in the invention, in the case where the curing by light is applied, it is preferred to add the photopolymerization initiator. As the photopolymerization initiator, there can be cited, for example, carbonyl compounds, such as acetophenone, 2,2-diethoxy acetophenone, p-dimethyl acetophenone, p-dimethylamino propiophenone, benzophenone, 2-chlorobenzophenone, 4,4'-dichlorobenzophenone, 4,4'-bisdiethyl amino-benzophenone, Michler ketone, benzyl, benzoin, benzoin methyl ether, benzoin ethyl ether, benzoin isopropyl ether, methyl benzoyl formate, p-isopropyl-α-hydroxy isobutylphenone, α-hydroxy isobutylphenone, 2,2-dimethoxy-2-phenyl acetophenone, 1-hydroxycyclohexyl phenyl ketone, etc., sulfur compounds, such as tetramethylthiuram monosulfide, tetramethylthiuram disulfide, thioxanthone, 2-chlorothioxanthone, 2-methylthioxanthone, etc., peroxide compounds, such as benzoyl peroxide, di-t-butyl peroxide, etc., etc.

The amount of the photopolymerization initiator used is preferred to be 0.01 to 10 mass parts relative to 100 mass parts of a polymerizable composition, and is preferred to be 0.05 to 5 mass parts as a range such that the photopolymerization initiator remains as an unreacted substance at the time of polymerization, and does not affect the gas barrier characteristic.

The coating liquid containing a resin that forms the crosslinked resin layer of the [A] layer for use in the invention is preferred to be compounded with an organic solvent within a range such that the effects of the invention are not marred, for the purpose of improving the operability during the coating step and controlling the coating film thickness. A preferred range of the organic solvent compounded is greater than or equal to 10 mass % and less than or equal to 90 mass % and, more preferably, greater than or equal to 20 mass % and less than or equal to 80 mass %.

As the organic solvent, for example, alcohol-based solvents, such as methanol, ethanol, isopropyl alcohol, etc., acetic acid ester-based solvents, such as methyl acetate, ethyl acetate, butyl acetate, etc., ketone-based solvents, such as acetone, methyl ethyl ketone, etc., aromatic base solvents such as toluene, etc., etc. can be used. These solvents may be used singly or as a mixture of two or more species thereof.

Furthermore, the coating liquid that contains a resin that forms the crosslinked resin layer of the [A] layer for use in the invention is preferred to be compounded with an inorganic particle, such as silica, alumina, zinc oxide, etc., for the purpose of improving the characteristic of adhesion with the [B] layer. Among these, silica-based inorganic particles that strongly adhere to the silicon-containing inorganic layer are preferred, and silica-based inorganic particles obtained by hydrolysis of a silane compound are more preferred. A preferred range of the inorganic particle compounded is greater than or equal to 0.1 mass % and less than or equal to 30 mass %, and a more preferred range is greater than or equal to 0.5 mass % and less than or equal to 10 mass %.

In the invention, various additives can be compounded according to need within such ranges that the effects of the invention are not marred. For example, stabilizing agents, such as an antioxidant, a light stabilizer, an ultraviolet absorber, etc., surface-active agents, leveling agents, antistatic agents, etc. can be used.

As for a method of causing the surface free energy of the [A] layer for use in the invention to be less than or equal to 45 mN/m, there can be cited methods in which a silicone with low surface tension, such as dimethyl polysiloxane, methyl phenyl polysiloxane, etc., is added in a range such that neither the characteristic of adhesion between the [A] layer and the [B] layer nor the gas barrier characteristic deteriorates, and in which a monomer having an alkyl group of a long chain, such as an n-stearyl acrylate or the like, which is oleophilic.

As for coating means for the coating liquid made up of a resin that forms the [A] layer, for example, a reverse coating method, a gravure coating method, a rod coating method, a bar coating method, a die coating method, a spray coating method, etc. can be used. Among these, the gravure coating method is preferred as a suitable technique for the coating of 0.5 μm or greater and 10 μm or less, which is the thickness of the [A] layer in the invention.

The actinic ray for use for crosslinking the [A] layer includes ultraviolet rays, electron beams, radiation rays (α rays, β rays and γ rays), etc., and ultraviolet rays are preferred as a practically easy and convenient method. Furthermore, the heat source for use for thermal crosslinking includes steam heaters, electric heaters, infrared heaters, etc., and infrared heaters are preferred from the viewpoint of stability of temperature control.

[Silicon—Containing Inorganic Layers]

Next, the silicon-containing inorganic layer whose thickness is 10 to 1000 nm, which is the [B] layer, will be described in detail. The silicon-containing inorganic layer in the invention has a [B] thickness of 10 to 1000 nm, and is disposed on the crosslinked resin layer whose pencil hardness is greater than or equal to H and whose surface free energy is less than or equal to 45 mN/m, which is the [A] layer.

As a result of consideration of the inventors, it has been found that it is possible to drastically improve the gas barrier characteristic by layering the [B] layer on the [A] layer.

A material that is suitably usable in the [B] layer in the invention is preferred to be silicon dioxide, which can be formed with a film quality being amorphous and compact and has an excellent gas barrier characteristic. Incidentally, "silicon dioxide" will sometimes be simply termed "$SiO_2$". Furthermore, depending on the condition at the time of production, silicon dioxide ($SiO_2$) is accompanied by production of materials (SiO to $SiO_2$) that have slight deviations from the composition ratio between silicon and oxygen in the composition formula presented on the left; however, these materials are to be termed silicon dioxide or $SiO_2$.

By layering the [B] layer on top of the [A] layer, the heat resistance and the thermal dimensional characteristic of the macromolecular base improve since the [A] layer is a crosslinked resin layer whose pencil hardness is greater than or equal to H. Then, by forming a layer of silicon dioxide on top of the [A] layer, the macromolecular base can be prevented from being damaged by ions and radicals of plasma at the time of formation of the layer of silicon dioxide, in comparison with the case where a layer of silicon dioxide is formed directly on the macromolecular base. Therefore, a compact silicon dioxide layer can be stably formed. Furthermore, since the surface free energy of the [A] layer is in the range of 45 mN/m and less, sputter particles on the silicon dioxide layer on the macromolecular base surface more easily spread on the surface, and the film quality in the vicinity of the macromolecular base surface becomes finer and more compact than in the related art, so that the gas barrier characteristic can be improved, according to a speculation.

The [B] layer, if it contains a silicon oxide, may contain an oxide, a nitride or a sulfide of an element, such as Zn, Al, Ti, Zr, Sn, In, Nb, Mo, Ta, etc., or a mixture thereof. For example, as a layer that brings about a high gas barrier characteristic, [B1] a layer made of a zinc oxide-silicon dioxide-aluminum oxide coexistence phase (hereinafter, simply termed the [B1] layer) or [B2] a layer made of a coexistence phase of zinc sulfide and silicon dioxide (hereinafter, simply termed the [B2] layer) is suitably used. Details of the [B1] layer and the [B2] layer will be separately described below.

Furthermore, on the [B] layer in the invention there may be formed a hard coat layer for the purpose of improving the abrasion-proofness within such a range that the gas barrier characteristic does not deteriorate or there may be provided a layered construction in which a film made up of an organic macromolecule compound is laminated.

The thickness of the [B] layer for use in the invention is preferred to be greater than or equal to 10 nm and less than or equal to 1000 nm as a thickness of the layer that manifests the gas barrier characteristic. If the thickness of the layer is thinner than 10 nm, a site where a sufficient gas barrier characteristic cannot be secured occurs, sometimes giving rise to a problem of the gas barrier characteristic varying in the surface of the macromolecular base. Furthermore, if the thickness of the layer is thicker than 1000 nm, the stress that remains in the layer becomes large so that cracks more readily occur in the [B] layer due to warpage or impacts from outside; therefore, the gas barrier characteristic may sometimes decline along with use. Therefore, the thickness of the [B] layer is preferred to be greater than or equal to 10 nm and less than or equal to 1000 nm, and is more preferred to be greater than or equal to 100 nm and less than or equal to 500 nm from the viewpoint of securing a flexibility. The thickness of the [B] layer can usually be measured through observation of a cross-section thereof by a transmission type electron microscope (TEM).

The average surface roughness Ra of the [B] layer for use in the invention is preferred to be less than or equal to 1.5 nm as a surface roughness at which the gas barrier characteristic is manifested. If the average surface roughness is greater than 1.5 nm, the shape of irregularities on the surface of the [B] layer becomes large so that gaps are formed between sputter particles that are layered and therefore the film quality does not easily become compact. Therefore, even if the layer is formed to have a great film thickness, the effect of improving the gas barrier characteristic is not easily obtained. Therefore, the average surface roughness Ra of the [B] layer is preferred to be less than or equal to 1.5 nm, and is more preferred to be less than or equal to 0.8 nm.

The average surface roughness Ra of the [B] layer in the invention can be measured by using an atomic force microscope. Incidentally, in the case where the [B] layer surface is laminated with the inorganic layer or the resin layer, a value obtained by using the X-ray reflectivity technique (mentioned above) is set as an average surface roughness Ra of the [B] layer.

The method of forming the [B] layer is not particularly limited. For example, it can be formed by a vacuum deposition method, a sputtering method, an ion plating method, a CVD method, etc. Among these methods, the sputtering method is preferred as a method capable of forming the [B] layer easily and inexpensively.

[Layer Made Up of Zinc Oxide-Silicon Dioxide-Aluminum Oxide Coexistence Phase]

Next, as the [B1] layer suitably usable as the silicon-containing inorganic layer in the invention, a layer made up of a zinc oxide-silicon dioxide-aluminum oxide coexistence phase will be described in detail. Incidentally, the "zinc oxide-silicon dioxide-aluminum oxide coexistence phase" will sometimes be simply termed the "$ZnO—SiO_2—Al_2O_3$". Furthermore, depending on the condition at the time of production, silicon dioxide ($SiO_2$) is accompanied by production of materials (SiO to $SiO_2$) that have slight deviations from the composition ratio between silicon and oxygen in the composition formula presented on the left; however, these materials are to be termed silicon dioxide or $SiO_2$. With regard to such deviations of the composition ratio from the chemical formula, the same handling is applied regarding zinc oxide and aluminum oxide, that is, such materials are to be termed zinc oxide or ZnO and aluminum oxide or $Al_2O_3$, despite deviations in composition ratio that depend on the condition at the time of production.

A reason why the gas barrier characteristic is made good by applying the [B1] layer in the gas barrier characteristic film of the invention is speculated to be that in the zinc oxide-silicon dioxide-aluminum oxide coexistence phase, due to coexistence of a crystalline component contained in zinc oxide and an amorphous component of silicon dioxide, crystal growth of zinc oxide, which tends to produce microcrystals, is restrained, and the particle diameter becomes small, and therefore the layer becomes compact and hence permeation of oxygen and water vapor is restrained.

Furthermore, it is also considered that due to coexistence with aluminum oxide, crystal growth can be restrained more than in the case where zinc oxide and silicon dioxide are caused to coexist, and therefore that decline in the gas barrier characteristic that results from production of cracks could successfully be retrained.

The composition of the [B1] layer can be measured by an ICP emission spectrometry method as described below. The Zn atom concentration measured by the ICP emission spectrometry method is preferred to be 20 to 40 atom %, the Si atom concentration measured thereby is preferred to be 5 to 20 atom %, the Al atom concentration is preferred to be 0.5 to 5 atom %, and the O atom concentration is preferred to be 35 to 70 atom %. If the Zn atom concentration is greater than 40 atom % or the Si atom concentration is smaller than 5 atom %, oxides that restrain the crystal growth of zinc oxide become insufficient in amount, so that void portions or defect portions increase and, sometimes, a sufficient gas barrier characteristic cannot be obtained. If the Zn atom concentration is smaller than 20 atom % or the Si atom concentration is greater than 20 atom %, an amorphous component of silicon dioxide within the layer increases so that the flexibility of the layer may sometimes decline. Furthermore, if the Al atom concentration is greater than 5 atom %, the affinity between zinc oxide and silicon dioxide becomes excessively high, so that the pencil hardness of the film increases and therefore, sometimes, cracks become more likely to occur with respect to heat or to stress from outside. If the Al atom concentration is smaller than 0.5 atom %, the affinity between zinc oxide and silicon dioxide becomes insufficient, so that the binding force between the particles that form the layer cannot improve and therefore the flexibility sometimes declines. Furthermore, if the O atom concentration is greater than 70 atom %, the amount of defects in the [A] layer increases and, therefore, a predetermined gas barrier characteristic sometimes cannot be obtained. If the O atom concentration is smaller than 35 atom %, the state of oxidation of zinc, silicon and aluminum becomes insufficient so that crystal growth cannot be restrained and the particle diameter increases; therefore, the gas barrier characteristic sometimes deteriorates. From these viewpoints, it is more preferred that the Zn atom concentration be 25 to 35 atom %, the Si atom concentration be 10 to 15 atom %, the Al atom concentration be 1 to 3 atom % and the O atom concentration be 50 to 64 atom %.

The components contained in the [B1] layer are not particularly limited as long as zinc oxide, silicon dioxide and aluminum oxide are present in the foregoing composition ranges and consist a major component; for example, it does not matter if the [B1] layer contains metal oxides formed from Al, Ti, Zr, Sn, In, Nb, Mo, Ta, Pd, etc. Being the major component herein usually means being greater than or equal to 60 mass % in the composition of the [B1] layer, and it is preferred if the amount of major component is greater than or equal to 80 mass %.

As for the composition of the [B1] layer, since the layer is formed so as to have substantially the same composition as the mixed sintered material used at the time of formation of the layer, the composition of the [B1] layer can be adjusted by using a mixed sintered material whose composition is set according to a targeted composition of the layer.

As for chemical composition analysis of the [B1] layer, each of the elements, that is, zinc, silicon and aluminum, is quantitatively analyzed by using an ICP emission spectrometry method, so that the composition ratios of zinc oxide, silicon dioxide, aluminum oxide and inorganic oxides contained can be known. Incidentally, as for oxygen atoms, calculation is performed on the assumption that zinc atoms, silicon atoms and aluminum atoms present as zinc oxide (ZnO), silicon dioxide ($SiO_2$) and aluminum oxide ($Al_2O_3$), respectively. The ICP emission spectrometry is an analytical technique capable of simultaneously measuring many elements from an emission spectrum that occurs when a specimen is introduced together with argon gas into a plasma light source portion, and can be applied to the chemical composition analysis. In the case where the inorganic layer and the resin layer are layered on the [B] layer, the ICP emission spectrometry can be performed after those layers are removed by ion etching or a chemical solution treatment according to need.

The method of forming the [B1] layer on the macromolecular base is not particularly limited. The [B1] layer can be formed by a vacuum deposition method, a sputtering method, an ion plating method, etc., through the use of a mixed sintered material made up of zinc oxide, silicon dioxide and aluminum oxide. In the case where zinc oxide, silicon dioxide and aluminum oxide are used as simplex materials, zinc oxide, silicon dioxide and aluminum oxide, separately from different vapor deposition sources or sputter electrodes, are simultaneously deposited and formed into a film and mixed so that a desired composition is obtained. Among these methods, the method of forming the [B1] layer for use in the invention is more preferred to be the sputtering method that uses a mixed sintered material, from the viewpoint of gas barrier characteristic and of chemical composition reproducibility of the layer formed.

[Layer Made Up Coexistence Phase of Zinc Sulfide and Silicon Dioxide]

Next, as a [B2] layer, a layer made of a coexistence phase of zinc sulfide and silicon dioxide will be described in detail. Incidentally, the "zinc sulfide-silicon dioxide coexistence phase" will sometimes be simply termed the "$ZnS—SiO_2$". Furthermore, depending on the condition at the time of production, silicon dioxide ($SiO_2$) is accompanied by production of materials (SiO to $SiO_2$) that have slight deviations from the composition ratio between silicon and oxygen in the composition formula presented on the left; however, these materials are to be termed silicon dioxide or $SiO_2$.

A reason why the gas barrier characteristic is made good by applying the [B2] layer in the gas barrier characteristic film of the invention is speculated to be that in the zinc sulfide-silicon dioxide coexistence phase, due to coexistence of a crystalline component contained in zinc sulfide and an amorphous component of silicon dioxide, crystal growth of zinc sulfide, which tends to produce microcrystals, is restrained, and the particle diameter becomes small, and therefore the layer becomes compact and hence permeation of oxygen and water vapor is restrained. Furthermore, it is also considered that since the zinc sulfide-silicon dioxide coexistence phase, containing zinc sulfide, whose crystal growth is restrained, is superior in flexibility to a layer formed only from inorganic oxides or metal oxides, cracks in the zinc sulfide-silicon dioxide coexistence phase are less likely to occur with respect to heat or to stress from outside, so that application of the [B2] layer could successfully restrain the decline in the gas barrier characteristic caused by formation of cracks.

As for the composition of the [B2] layer, the molar fraction of zinc sulfide to the sum of zinc sulfide and silicon dioxide is preferred to be 0.7 to 0.9. If the molar fraction of zinc sulfide to the sum of zinc sulfide and silicon dioxide is greater than 0.9, the oxides that restrain the crystal growth of zinc sulfide become insufficient in amount, so that void portions or defect portions increase and, sometimes, a predetermined gas barrier characteristic cannot be obtained. Furthermore, if the molar fraction of zinc sulfide to the sum of zinc sulfide and silicon dioxide is smaller than 0.7, the amorphous component of silicon dioxide within the [B2] layer increases and the flexibility of the layer declines, so that the flexibility of the gas barrier characteristic film with respect to mechanical bending sometimes declines. More preferably, the molar fraction of zinc sulfide is within the range of 0.75 to 0.85.

The components contained in the [B2] layer are not particularly limited as long as zinc sulfide and silicon dioxide are present in the foregoing composition ranges and consist a major component; for example, it does not matter if the [B1] layer contains metal oxides formed from Al, Ti, Zr, Sn, In, Nb, Mo, Ta, Pd, etc. Being the major component herein usually means being greater than or equal to 60 mass % in the composition of the [B2] layer, and it is preferred if the amount of the major component is greater than or equal to 80 mass %.

As for the composition of the [B2] layer, since the layer is formed so as to have substantially the same composition as the mixed sintered material used at the time of formation of the layer, the composition of the [B2] layer can be adjusted by using a mixed sintered material whose composition accords to a target.

As for the chemical composition analysis of the [B2] layer, the composition ratios of zinc and silicon are firstly found by ICP emission spectrometry and, by using Rutherford backscattering spectrometry on the basis of these found values, each of the elements is quantitatively analyzed, so that the composition ratios of zinc sulfide, silicon dioxide and inorganic oxides contained can be known. The ICP emission spectrometry is an analytical technique capable of simultaneously measuring many elements from an emission spectrum that occurs when a specimen is introduced together with argon gas into a plasma light source portion, and can be applied to the chemical composition analysis. Furthermore, in the Rutherford backscattering spectrometry, a specimen is irradiated with charged particles accelerated by high voltage, and elements are identified and quantified from the number and energy of charged particles bouncing back therefrom, so that the composition ratios of the individual elements can be known. Incidentally, since the [B2] layer is a composite layer made up of sulfide and oxide, an analysis based on the Rutherford backscattering spectrometry, which allows a composition ratio analysis of sulfur and oxygen, is carried out. In the case where the inorganic layer and the resin layer are layered on the [B2] layer, analysis can be accomplished by the ICP emission spectrometry and the Rutherford backscattering spectrometry after those layers are removed by ion etching or a chemical solution treatment according to need.

The method of forming the [B2] layer on a transparent macromolecular base is not particularly limited. The [B2] layer can be formed thereon by a vacuum deposition method, a sputtering method, an ion plating method, etc., through the use of a mixed sintered material made up of zinc sulfide and silicon dioxide. In the case where zinc sulfide and silicon dioxide are used as simplex materials, zinc sulfide and silicon dioxide, separately from different vapor deposition sources or sputter electrodes, are simultaneously deposited and formed into a film and mixed so that a desired composition is obtained. Among these methods, the method of forming the [B2] layer for use in the invention is more preferred to be the sputtering method that uses a mixed sintered material, from the viewpoint of gas barrier characteristic and of chemical composition reproducibility of the layer formed.

[Transparent Electroconductive Layer]

Since the gas barrier characteristic film of the invention is excellent in the gas barrier characteristic against oxygen, water vapor, etc., the gas barrier characteristic film can be used as wrapping materials for foods or medicines, or as display units' elements of electronic papers, organic EL television sets, etc., members of electronic devices, such as solar batteries and the like. That is, high endurance with less change in electric resistance caused by oxygen or water vapor from outside can be given by providing a transparent electroconductive layer on the [B] layer surface or between the macromolecular base and the [A] layer and sealing the display unit's element or the electronic device.

The transparent electroconductive layer for use in the invention is preferred to contain, for example, any one of indium tin oxide (ITO), zinc oxide (ZnO), aluminum-containing zinc oxide (Al/ZnO), gallium-containing zinc oxide (Ga/ZnO), a metal nanowire and a carbon nanotube. The thickness of the transparent electroconductive layer is preferred to be in the range of 0.1 to 500 nm, and is more preferred to be in the range of 5 to 300 nm as a range for good transparency.

As a method of forming the transparent electroconductive layer, common methods, including dry coating methods, such as vacuum deposition, EB deposition, sputter deposition, etc., wet coating methods, such as casting, spin coating, dip coating, bar coating, spraying, blade coating, slit die coating, gravure coating, reverse coating, screen printing, mold application, print transcription, inkjet, etc., etc. can be cited.

EXAMPLES

Hereinafter, the invention will be concretely described with reference to Examples. However, the invention is not limited to Examples below.

[Evaluation Methods]

Firstly, evaluation methods for Examples and Comparative Examples will be described. The evaluation n number was determined as n=5, unless otherwise specified, when average values were found.

(1) Thickness of Layer

Section observation samples were made by an FIB method (concretely, on the basis of a method described in "Macromolecule Surface Processing Technology" (by Iwamori Satoru), pp. 118 to 119) through the use of a micro-sampling system (FB-2000A by Hitachi). Using a transmission type electron microscope (H-9000UHRII by Hitachi) with an acceleration voltage of 300 kV, sections of the observation samples were observed, and the thicknesses of the [A] layer and the [B] layer were measured. The interfaces between the base and the [B] layer and between the [A] layer and the [B] layer were determined in section observation photographs taken by the transmission type electron microscope.

(2) Pencil Hardness Test

As for the pencil hardness of the [A] layer, pencil hardness was measured with n=1, by using a pencil hardness tester HEIDON-14 (Shinto Kagaku (KK)), according to JIS K5600-5-4 (1999).

(3) Surface Free Energy

With regard to the [A] layer surface, using measurement liquids (water, formamide, ethylene glycol and methylene iodide) whose surface free energy and components (dispersion force, polar force and hydrogen bonding force) were known, the contact angle of each of the liquids on the laminated film was measured by a contact angle gauge CA-D type (by Kyowa Kaimen Kagaku (KK)) under the condition of a temperature of 23° C. and a relative humidity of 65%. For measurement, average values of five pieces were used. This value was calculated by using the following expression (1) derived from the extended Fowkes' equation and Young's equation.

[EXPRESSION 2]

$$(\gamma Sd \cdot \gamma Ld)^{0.5} + (\gamma Sp \cdot \gamma Lp)^{0.5} + (\gamma Sh \cdot \gamma Lh)^{0.5} = \frac{\gamma L(1 + \cos\theta)}{2} \quad (1)$$

where $\gamma S = \gamma Sd + \gamma Sp + \gamma Sh$, and $\gamma L = \gamma Ld + \gamma Lp + \gamma Lh$
$\gamma S$: surface energy of [A] layer
$\gamma Sd$: dispersion force component of [A] layer
$\gamma Sp$: polar force component of [A] layer
$\gamma Sh$: hydrogen bonding force of [A] layer
$\gamma L$: surface energy of measurement liquid
$\gamma Ld$: dispersion force component
$\gamma Lp$: polar force component
$\gamma Lh$: hydrogen bonding force
$\theta$: contact angle of measurement liquid on [A] layer (4) Average Surface Roughness Ra Using an atomic force microscope, measurement with regard to the crosslinked resin layer surface, that is, the [A] layer, was performed under the following conditions.
System: NanoScopeIII/MMAFM (by Digital Instruments Co.)
Scanner: AS-130 (T-Scanner)
Probe: NCH-W type, mono-crystal silicon (by NanoWorld Co.)
Scan mode: tapping mode
Scan field: 10 μm×10 μm
Scan speed: 0.5 Hz Measurement environment: temperature of 23° C., relative humidity of 65%, in atmosphere.

(5) Water Vapor Permeability (g/(m²·d))

Measurement was performed by using a water vapor permeability permeability measurement apparatus (model name: DELTAPERM (registered trademark)) made by Technolox Co., UK, under the condition of a temperature of 40° C., a relative humidity of 90% RH and a measurement area of 50 cm². The number of samples was two specimens per level, and the number of times of performing measurement was five times per specimen, and an average value of 10 points obtained was determined as a water vapor permeability (g/(m²·d)).

(6) Composition of [B1] Layer

The chemical composition analysis of the [B1] layer was performed by ICP emission spectrometry (SPS4000 by SII Nano Technology Co.). Specimens were decomposed by heating with nitric acid and sulfuric acid, and then were dissolved by warming with dilute nitric acid, and separated by filtration. An insoluble fraction, after being heated and ashed, was melted with sodium carbonate, and was dissolved with dilute nitric acid. The obtained solution was combined with the aforementioned filtrate, and the volume was raised to a predetermined volume. With regard to this solution, the contents of zinc atoms, silicon atoms and aluminum atoms were measured, and were converted into atom number ratios. Incidentally, as for oxygen atoms, a calculated value was found on the assumption that the zinc atoms, the silicon atoms and the aluminum atoms are present as zinc oxide (ZnO), silicon dioxide ($SiO_2$) and aluminum oxide ($Al_2O_3$).

(7) Composition of [B2] Layer

The chemical composition analysis of the [B2] layer was performed by ICP emission spectrometry (SPS4000 by SII Nano Technology Co.). Specimens were decomposed by heating with nitric acid and sulfuric acid, and then were dissolved by warming with dilute nitric acid and separated by filtration. An insoluble fraction, after being heated and ashed, was melted with sodium carbonate, and was dissolved with dilute nitric acid. The obtained solution was combined with the aforementioned filtrate, and the volume was raised to a predetermined volume. With respect to this solution, the contents of zinc atoms and silicon atoms were measured. Next, using the Rutherford backscattering spectrometry (AN-2500 made by Nisshin High Voltage Co.) on the basis of these values, the zinc atoms, the silicon atoms, the sulfur atoms and the oxygen atoms were quantitatively analyzed, and composition ratios of zinc sulfide and silicon dioxide were found.

(8) Composition of [B3] Layer

By using an X-ray photoelectron spectroscopy method (XPS method), the atom ratio of oxygen atoms to aluminum atoms (O/Al ratio) was measured. The measurement condition was as follows.

Device: Quantera SXM (by PHI Co.)
Energized X ray: monochromatic AlKα1,2
X ray diameter 100 μm
Photoelectron escape angle: 10°

[Formation of [B1],[B2] Layers]

([B1] Layer)

Figure 2:
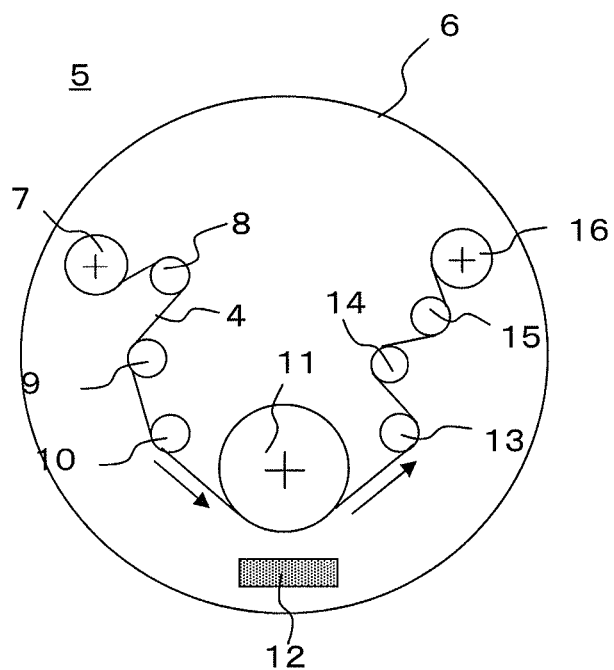
FIG. 2 is a general diagram schematically showing a wind-up type sputtering apparatus for producing the gas barrier characteristic film of the invention.

Using a wind-up type sputtering apparatus having a structure shown in FIG. 2, the sputtering with argon gas and oxygen gas was carried out after a sputter target that was a mixed sintered material formed from zinc oxide, silicon dioxide and aluminum oxide was placed on a sputter electrode 12. The [B1] layer was provided on a sputter electrode 12-side surface of the macromolecular base 4 (on the [A] layer in the case where the [A] layer had been formed, or on the macromolecular base in the case where the [A] layer had not been formed).

Concrete operations were as follows. Firstly, in a wind-up chamber 6 of the wind-up type sputter apparatus 5 in which a sputter target having being sintered at a zinc oxide/silicon dioxide/aluminum oxide composition mass ratio of 77/20/3 was placed on the sputter electrode 12, the macromolecular base 4 was set on a wind-off roll 7 so that a surface of the base 4 on the side on which the [B1] layer was to be provided faced the sputter electrode 12, and then was wound off and passed around a cooling drum 11 via guide rolls 8, 9 and 10. Argon gas and oxygen gas were introduced, with the oxygen gas's partial pressure being 10%, so that the depressurization degree became 2×10 Pa. By applying a making electric power of 4000 W from a direct-current power source, an argon-oxygen gas plasma was generated, so that the [B1] layer was formed on the surface of the macromolecular base 4 by sputtering. The thickness of the layer was adjusted by film conveyance speed. After that, the film was wound up on a wind-up roll 16 via guide rolls 13, 14 and 15.

([B2] Layer)

Using the wind-up type sputtering apparatus having the structure shown in FIG. 2, the sputtering with argon gas and oxygen gas was carried out after a sputter target that was a mixed sintered material formed from zinc oxide, silicon dioxide and aluminum oxide was placed on the sputter electrode 12. The [B2] layer was provided on a sputter electrode 12-side surface of the macromolecular base 4 (on the [A] layer in the case where the [A] layer had been formed, or on the macromolecular base in the case where the [A] layer had not been formed).

Concrete operations were as follows. Firstly, in the wind-up chamber 6 of the wind-up type sputter apparatus 5 in which a sputter target having being sintered at a zinc sulfide/silicon dioxide mole composition ratio of 80/20 was placed on the sputter electrode 12, the macromolecular base 4 was set on the wind-off roll 7, and then was wound off and passed around the cooling drum 11 via the guide rolls 8, 9 and 10. Argon gas was introduced so that the depressurization degree became $2×10^{-1}$ Pa. By applying a making electric power of 500 W from a high-frequency power source, an argon gas plasma was generated, so that the [B2] layer was formed on the surface of the macromolecular base 4 by sputtering. The thickness of the layer was adjusted by film conveyance speed. After that, the film was wound up on the wind-up roll 16 via the guide rolls 13, 14 and 15.

([B3] Layer)

Using the wind-up type sputtering apparatus having the structure shown in FIG. 2, the sputtering with argon gas and oxygen gas was carried out after a sputter target that was a mixed sintered material formed from zinc oxide, silicon dioxide and aluminum oxide was placed on the sputter electrode 12. The [B3] layer was provided on a sputter electrode 12-side surface of the macromolecular base 4 (on the [A] layer in the case where the [A] layer had been formed, or on the macromolecular base in the case where the [A] layer had not been formed).

Concrete operations were as follows. Firstly, in the wind-up chamber 6 of the wind-up type sputter apparatus 5 in which a sputter target having being sintered with the atom number ratio of oxygen atoms to aluminum atoms (O/Al ratio) being 1.5, was placed on the sputter electrode 12, the macromolecular base 4 was set on the wind-off roll 7, and then was wound off and passed around the cooling drum 11 via the guide rolls 8, 9 and 10. Argon gas was introduced so that the depressurization degree became $2×10^{-1}$ Pa. By applying a making electric power of 500 W from a high-frequency power source, an argon gas plasma was generated, so that the [B3] layer was formed on the surface of the macromolecular base 4 by sputtering. The thickness of the layer was adjusted by film conveyance speed. After that, the film was wound up on the wind-up roll 16 via the guide rolls 13, 14 and 15.

Example 1

As the macromolecular base, a 100 μm-thick polyethylene terephthalate film ("Lumirror (registered trademark)" U48 by Toray Industries, Inc. was used.

As a coating liquid for forming the [A] layer, a coating liquid 1 in which 100 mass parts of urethane acrylate (Pholucid 420C by Chugoku Toryo (KK)) was diluted with 70 mass parts of toluene was prepared. Next, the coating liquid 1 was applied to one surface of the macromolecular base by a micro-gravure coater (gravure line No. 200UR, gravure rotation ratio of 100%). After being dried at 60° C. for one minute, the coating liquid 1 applied was irradiated with ultraviolet ray at 1 J/cm$^2$ to cure. Thus, the [A] layer (termed A1) of 3 μm in thickness was provided.

Test pieces of 100 mm in length and 100 mm in width were cut out from the film provided with the [A] layer, evaluation of the [A] layer in terms of the pencil hardness test, the surface free energy and the average surface roughness. Results are shown in Table 1.

Next, the [B1] layer was formed to a thickness of 200 nm on the [A] layer to obtain a gas barrier characteristic film. As for the composition of the [A] layer, the Zn atom concentration was 27.5 atom %, the Si atom concentration was 13.1 atom %, the Al atom concentration was 2.3 atom %, and the O atom concentration was 57.1 atom %.

Test pieces of 100 mm in length and 140 nm in width were cut out from the gas barrier characteristic film obtained, and evaluation of the water vapor permeability was carried out. Results are shown in Table 1.

Example 2

A gas barrier characteristic film was obtained in substantially the same manner as in Example 1, except that, as a coating liquid for forming the [A] layer, a coating liquid 2 in which 100 mass parts of polyester acrylate (FOP-1740 by Nippon Kayaku (KK)) instead of urethane acrylate contained 0.2 mass part of silicone oil (SH190 by Dow Corning Toray (KK)) added thereto, and was diluted with 50 mass parts of toluene and with 50 mass parts of MEK was prepared, and that the coating liquid 2 was applied by a micro-gravure coater (gravure line No. 200UR, gravure rotation ratio of 100%), and after being dried at 60° C. for one minute, the coating liquid 1 applied was irradiated with ultraviolet ray at 1 J/cm$^2$ to cure, and therefore the [A] layer (termed A2) of 5 gam in thickness was provided.

Example 3

A gas barrier characteristic film was obtained in substantially the same manner as in Example 1, except that instead of the [B1] layer, the [B2] layer was provided so as to have a thickness of 200 nm.

As for the composition of the [B2] layer, the molar fraction of the zinc sulfide was 0.80.

Example 4

A gas barrier characteristic film was obtained in substantially the same manner as in Example 2, except that instead of the [B1] layer, the [B2] layer was provided so as to have a thickness of 200 nm.

As for the composition of the [B2] layer, the molar fraction of the zinc sulfide was 0.80.

Example 5

A gas barrier characteristic film was obtained in substantially the same manner as in Example 1, except that the [B1] layer was provided so as to have a thickness of 850 nm.

Example 6

A gas barrier characteristic film was obtained in substantially the same manner as in Example 2, except that the [B1] layer was provided so as, to have a thickness of 950 nm.

Comparative Example 1

A gas barrier characteristic film was obtained in substantially the same manner as in Example 1, except that a polyethylene terephthalate film ("Lumirror (registered trademark)" U35 by Toray Industries, Inc.) was used as the macromolecular base, and that the [A] layer was not formed, and the [B1] layer was formed directly on a surface of the macromolecular base so as to have a thickness of 100 nm.

Comparative Example 2

A gas barrier characteristic film was obtained in substantially the same manner as in Example 1, except that a polyethylene naphthalate film (Q65FA by Teijin Limited) was used as the macromolecular base, and that the [A] layer was not formed, and the [B1] layer was formed directly on a surface of the macromolecular base so as to have a thickness of 100 nm.

Comparative Example 3

A gas barrier characteristic film was obtained in substantially the same manner as in Example 3, except that a polyethylene terephthalate film ("Lumirror (registered trademark)" U35 by Toray Industries, Inc.) was used as the macromolecular base, and that the [A] layer was not formed, and the [B2] layer was formed directly on a surface of the macromolecular base so as to have a thickness of 100 nm.

Comparative Example 4

A gas barrier characteristic film was obtained in substantially the same manner as in Example 3, except that a polyethylene naphthalate film (Q65FA by Teijin Limited) was used as the macromolecular base, and that the [A] layer was not formed, and the [B2] layer was formed directly on a surface of the macromolecular base so as to have a thickness of 100 nm.

Comparative Example 5

A gas barrier characteristic film was obtained in substantially the same manner as in Example 1, except that the thickness of the [B1] layer was 1200 nm.

Comparative Example 6

A gas barrier characteristic film was obtained in substantially the same manner as in Example 3, except that the thickness of the [B2] layer was 1200 nm.

Comparative Example 7

A gas barrier characteristic film was obtained substantially the same manner as in Example 1, except that, as a coating liquid for forming the [A] layer, a coating liquid 3 having a solid fraction concentration of 12% was prepared, instead of urethane acrylate, by weighing 10 mass parts of (15 mass % in solid fraction concentration) of "Sepolsion" (registered trademark) VH 100 by Sumitomo Seika Chemicals Co., Ltd., which is a coating agent having an EVOH-based resin dispersed in water, and adding to it 1.9 mass parts of water and 0.6 mass part of isopropanol as diluting solvents, and stirring the liquid for 30 minutes, and that, then, the coating liquid 1 was applied by using a wire bar, and was dried at 120° C. for 40 seconds to provide an [A] layer of 1 μm in thickness (termed A3).

Comparative Example 8

A gas barrier characteristic film was obtained in substantially the same manner as in Comparative Example 7, except that, instead of the [B1] layer, the [B2] layer was provided so as to have a thickness of 200 nm.

Comparative Example 9

A gas barrier characteristic film was obtained in substantially the same manner as in Example 2, except that 0.2 mass part of silicone oil (SH 190 by Toray Dow Corning (KK)) was not added to the coating liquid for forming the [A] layer.

Comparative Example 10

A gas barrier characteristic film was obtained in substantially the same manner as in Example 3, except that, instead of the [B2] layer, the [B3] layer was provided so as to have a thickness of 200 nm.

As for the composition of the $Al_2O_3$ layer, the atom number of ratio of oxygen atoms to aluminum atoms (O/Al ratio) was 1.65.

TABLE 1

| | | [A] layer | | | | [B] layer | | Water vapor |
|---|---|---|---|---|---|---|---|---|
| | Macromolecular base * | Material | Pencil Hardness | Surface free energy (mN/m) | Average surface roughness Ra (nm) | Material | Thickness (nm) | permeability (g/(m$^2$·d)) |
| Example 1 | 1 | A1 | 2H | 31.2 | 0.8 | B1 | 200 | $9.3 \times 10^{-4}$ |
| Example 2 | 1 | A2 | 3H | 26.1 | 0.7 | B1 | 200 | $7.3 \times 10^{-4}$ |
| Example 3 | 1 | A1 | 2H | 31.2 | 0.8 | B2 | 200 | $4.3 \times 10^{-4}$ |
| Example 4 | 1 | A2 | 3H | 26.2 | 0.7 | B2 | 200 | $6.3 \times 10^{-4}$ |
| Example 5 | 1 | A1 | 2H | 31.2 | 0.8 | B1 | 850 | $3.1 \times 10^{-4}$ |
| Example 6 | 1 | A2 | 3H | 26.1 | 0.7 | B1 | 950 | $2.8 \times 10^{-4}$ |
| Comparative Example 1 | 1 | — | — | 47.0 | 1.4 | B1 | 200 | $5.1 \times 10^{-2}$ |
| Comparative Example 2 | 2 | — | — | 35.3 | 1.1 | B1 | 200 | $4.4 \times 10^{-2}$ |
| Comparative Example 3 | 1 | — | — | 47.0 | 1.4 | B2 | 200 | $1.5 \times 10^{-2}$ |
| Comparative Example 4 | 2 | — | — | 35.3 | 1.1 | B2 | 200 | $2.3 \times 10^{-2}$ |
| Comparative Example 5 | 1 | A1 | 2H | 31.2 | 0.8 | B1 | 1200 | $9.3 \times 10^{-3}$ |
| Comparative Example 6 | 1 | A1 | 2H | 31.2 | 0.8 | B2 | 1200 | $8.3 \times 10^{-3}$ |
| Comparative Example 7 | 1 | A3 | F | 48.8 | 0.8 | B1 | 200 | $3.1 \times 10^{-2}$ |
| Comparative Example 8 | 1 | A3 | F | 49.3 | 0.7 | B2 | 200 | $1.5 \times 10^{-2}$ |
| Comparative Example 9 | 1 | A2 | 3H | 47.8 | 0.9 | B1 | 200 | $8.7 \times 10^{-3}$ |
| Comparative Example 10 | 1 | A2 | 3H | 26.1 | 0.7 | B3 | 200 | $3.4 \times 10^{-2}$ |

* 1: polyethylene terephthalate
2: polyethylene naphthalate

The gas barrier characteristic film of the invention, because of being excellent in the gas barrier characteristic against oxygen gas, water vapor, etc., can be usefully used as, for example, wrapping materials for foods, medicines, etc., and members of electronic devices, such as thin-screen televisions, solar batteries, etc. However, the use of the gas barrier characteristic film of the invention is not limited to these uses.

DESCRIPTION OF REFERENCE CHARACTERS

1: macromolecular base
2: [A] layer
3: [B] layer
4: macromolecular base
5: wind-up type sputtering apparatus
6: wind-up chamber
7: wind-off roll 8, 9, 10: wind-off-side guide roll
11: cooling drum
12: sputter electrode
13, 14, 15: wind-up-side guide roll
16: wind-up roll

The invention claimed is:

1. A gas barrier characteristic film in which an [A] layer and a [B] layer are layered in this order on at least one surface of the macromolecular base,
   the [A] layer being a crosslinked resin layer whose pencil hardness is greater than or equal to H and whose surface free energy is less than or equal to 45 mN/m, and
   the [B] layer being a silicon-containing inorganic layer whose thickness is 10 to 1000 nm.

2. The gas barrier characteristic film according to claim 1, wherein the [B] layer is constructed of a composition that contains a zinc compound and a silicon oxide.

3. The gas barrier characteristic film according to claim 2, wherein the [B] layer is one of a [B1] layer and a [B2] layer mentioned below,
   the [B1] layer being a layer made up of a coexistence phase of the zinc oxide, a silicon dioxide and an aluminum oxide, and
   the [B2] layer being a layer made up of a coexistence phase of a zinc sulfide and the silicon dioxide.

4. The gas barrier characteristic film according to claim 3, wherein the [B] layer is the [B1] layer, and wherein the [B1] layer is constructed of a composition in which a zinc (Zn) atom concentration is 20 to 40 atom %, an silicon (Si) atom concentration is 5 to 20 atom %, an aluminum (Al) atom concentration is 0.5 to 5 atom %, and an oxygen (O) atom concentration is 35 to 70 atom %, the atom concentrations being measured by an ICP emission spectrometry method.

5. The gas barrier characteristic film according to claim 3, wherein the [B] layer is the [B2] layer, and wherein the [B2] layer is constructed of a composition in which a molar fraction of the zinc sulfide relative to a sum of the zinc sulfide and the silicon dioxide is 0.7 to 0.9.

6. The gas barrier characteristic film according to claim 1, wherein an average surface roughness Ra of the [A] layer is less than or equal to 1 nm.

7. The gas barrier characteristic film according to claim 1, wherein an average surface roughness Ra of the [B] layer is less than or equal to 1.5 nm.

8. The gas barrier characteristic film according to claim 1, wherein the gas barrier characteristic film has a transparent electroconductive layer on a surface of the [B] layer or between the macromolecular base and the [A] layer.

9. The gas barrier characteristic film according to claim 1, wherein the transparent electroconductive layer contains any species selected from an indium tin oxide (ITO), a zinc oxide (ZnO), an aluminum-containing zinc oxide (Al/ZnO), a gallium-containing zinc oxide (Ga/ZnO), a metal nanowire and a carbon nanotube.

10. A solar battery having the gas barrier characteristic film according to claim 1.

11. A display unit's element having the gas barrier characteristic film according to claim 1.

* * * * *